United States Patent [19]

Mattox

[11] Patent Number: 5,637,261
[45] Date of Patent: Jun. 10, 1997

[54] ALUMINUM NITRIDE-COMPATIBLE THICK-FILM BINDER GLASS AND THICK-FILM PASTE COMPOSITION

[75] Inventor: Douglas M. Mattox, Rolla, Mo.

[73] Assignee: The Curators of the University of Missouri, Columbia, Mo.

[21] Appl. No.: 335,105

[22] Filed: Nov. 7, 1994

[51] Int. Cl.$^6$ ............................................. C03C 8/18
[52] U.S. Cl. .................... 252/514; 252/521; 501/17; 501/19; 501/20; 501/21; 501/32; 501/77
[58] Field of Search .................. 501/77, 14, 15, 501/17, 20, 21, 32, 19; 252/514, 521

[56] References Cited

U.S. PATENT DOCUMENTS

| | | | |
|---|---|---|---|
| 3,588,577 | 6/1971 | McVey et al. | 313/317 |
| 3,681,737 | 8/1972 | Magnusson et al. | 338/262 |
| 4,039,997 | 8/1977 | Huang et al. | 338/308 |
| 4,119,573 | 10/1978 | Ishida et al. | 252/519 |
| 4,172,919 | 10/1979 | Mitchell | 428/209 |
| 4,208,605 | 6/1980 | McVey et al. | 313/221 |
| 4,291,104 | 9/1981 | Barry et al. | 429/104 |
| 4,323,484 | 4/1982 | Hattori et al. | 252/521 |
| 4,567,151 | 1/1986 | Taylor | 501/15 |
| 4,597,897 | 7/1986 | Donohue | 252/518 |
| 4,624,934 | 11/1986 | Kokubu et al. | 501/32 X |
| 4,695,504 | 9/1987 | Watanabe et al. | 428/209 |
| 4,717,690 | 1/1988 | Hankey et al. | 501/20 |
| 4,788,163 | 11/1988 | Hang et al. | 501/17 |
| 4,861,734 | 8/1989 | MacDowell | 501/10 |
| 4,863,683 | 9/1989 | Nakatani et al. | 419/10 |
| 4,882,212 | 11/1989 | SinghDeo et al. | 428/76 |
| 4,985,176 | 1/1991 | Watanabe et al. | 252/521 |
| 4,985,377 | 1/1991 | Iseki et al. | 501/51 |
| 5,015,530 | 5/1991 | Brow et al. | 428/433 |
| 5,016,089 | 5/1991 | Fujii et al. | 357/80 |
| 5,028,567 | 7/1991 | Gotoh et al. | 501/10 |
| 5,033,666 | 7/1991 | Keusseyan et al. | 228/122 |
| 5,043,302 | 8/1991 | Mattox | 501/17 |
| 5,077,905 | 1/1992 | Matsumoto et al. | 357/74 |
| 5,089,172 | 2/1992 | Allison et al. | 252/512 |
| 5,112,777 | 5/1992 | MacDowell | 501/32 |
| 5,137,849 | 8/1992 | Brix et al. | 501/15 |
| 5,168,126 | 12/1992 | Matsumoto et al. | 174/52.4 |
| 5,179,047 | 1/1993 | Chiba | 501/15 |
| 5,202,292 | 4/1993 | Tanabe et al. | 501/17 |
| 5,256,603 | 10/1993 | Andrus et al. | 501/32 |
| 5,304,518 | 4/1994 | Sunahara et al. | 501/32 X |
| 5,470,506 | 11/1995 | Tanigami et al. | 501/77 |

FOREIGN PATENT DOCUMENTS

| | | | |
|---|---|---|---|
| 0 306 271 | 3/1989 | European Pat. Off. | H01B 1/16 |
| 27 15 894 | 10/1977 | Germany | C03C 3/08 |
| 42-23029 | 11/1967 | Japan . | |
| 2-283001 | 11/1990 | Japan . | |
| 4-96201 | 3/1992 | Japan . | |
| 1122866 | 8/1968 | United Kingdom | C03C 3/14 |

OTHER PUBLICATIONS

Harster, et al., "AlN-Compatible Thick Film Binder Glasses and Pastes." *ISHM '93 Proceedings*, pp. 393–398 No Date.

Bless, et al., "Applications of Glasses in Thick Film Technology." *Glasses for Electronic Applications*, pp. 397–417 No Date.

Wilkins, et al., "Oxynitride Based Glass Bonding to AlN For Thick Films." *ISHM '91 Proceedings*, pp. 533–535 No Date.

Yamaguchi, et al., "Oxidation Behavior of AlN in the Presence of Oxide and Glass for Thick Film Application." *IEEE Transactions on Components, Hydbrids, and Manufacturing Technology*, vol. 12, No. 3 (Sep. 1989), pp. 402–405.

Norton, M.G., "Thermodynamic considerations in the thick-film metallization of aluminum nitride substrates." (1990), pp. 91–93.

Hirayama, C., "Properties of Aluminoborate Glasses of Group II Metal Oxides: I, Glass Formation and Thermal Expansion." *Journal of The American Ceramic Society*, vol. 44, No. 12 (1961), pp. 602–606.

Zhong, et al., "Change in Boron Coordination Alkali Borate Glasses, and Mixed Alkali Effects, as Elucidated by NMR." *Journal of Non-Crystalline Solids 111*, (1989), pp. 67–76.

*Primary Examiner*—Karl Group
*Attorney, Agent, or Firm*—Senniger, Powers, Leavitt & Roedel

[57] ABSTRACT

Mixed alkaline earth boroaluminate glasses comprising BaO combined with at least one of CaO, SrO and MgO. The glasses are useful as frit binders in aluminum nitride-compatible, thick-film paste compositions used in thick-film printing of hybrid microelectronic circuits on aluminum nitride substrates.

20 Claims, No Drawings

ALUMINUM NITRIDE-COMPATIBLE THICK-FILM BINDER GLASS AND THICK-FILM PASTE COMPOSITION

BACKGROUND OF THE INVENTION

The present invention relates to mixed alkaline earth boroaluminate glasses and to aluminum nitride-compatible thick-film paste compositions containing mixed alkaline earth boroaluminate glass frits as a binder. The present invention also relates to a method for bonding a thick-film paste composition to an aluminum nitride substrate and to an aluminum nitride substrate having an electrically functional composition comprising a mixed alkaline earth boroaluminate glass frit binder bonded to at least a portion of a surface of the substrate.

Thick-film technology is an established, widely used method for efficiently producing high density, microelectronic circuit patterns on various substrates, commonly referred to as hybrid circuits. The lead patterns and resistors in hybrid circuits are applied by sequentially printing thick-film conductor, resistor and/or dielectric paste compositions onto suitable ceramic substrates (e.g., alumina). Generally, thick-film paste compositions include an electrically functional filler material (i.e., a conductor, resistor or dielectric), a binder (e.g., a glass frit) that promotes bonding of the filler material to the substrate and a liquid vehicle, usually an organic compound or polymer, which serves as a dispersion medium for the inorganic components of the paste. In printing, paste compositions are forced through a stencil, mask or screen of the desired pattern and onto the substrate. After printing, the coated substrate is dried and fired to bond the printed patterns to the substrate. When combined with discrete add-on components (e.g., chip devices), a thick-film, hybrid circuit is created.

Substrates provide the mechanical base and electrical insulating material onto which thick-film hybrid circuits are printed. The majority of substrates used in fabricating thick-film hybrid circuits are produced from ceramic materials because of mechanical strength, electrical resistivity over broad temperature ranges, chemical inertness and thermal conductivity. Alumina, which provides a good combination of these various properties, is currently the most widely used thick-film substrate. However, circuit density has reached levels today where considerable heat must be dissipated, and the thermal conductivity of alumina and other conventional substrate materials is often inadequate to allow sufficient cooling for the circuit elements to function properly. Thus, identifying suitable alternative substrates having improved thermal conductivity is becoming increasingly important in order to satisfy the thermal management requirements in today's higher speed microelectronics packaging.

When heat transfer and dissipation are a problem, beryllia substrates have been employed. However, beryllia is somewhat weaker than alumina and is more expensive. Furthermore, beryllia is highly toxic as a powder or vapor and requires special handling when fired at high temperatures.

Due to the thermal properties it possesses, aluminum nitride offers great promise as a non-toxic alternative to beryllia as a substrate material for use in high-power applications. Aluminum nitride exhibits high thermal conductivity, ranging from about 130 to over 200 W/m·K, as compared to about 20 W/m·K for alumina. Aluminum nitride also possesses a relatively low coefficient of thermal expansion (CTE) between about 4 and about $4.5 \times 10^{-6}$/K, which is close to that of silicon and gallium arsenide. As a result, aluminum nitride is suitable for direct attachment of very-large-scale integration (VLSI) dies. The combination of high thermal conductivity and low CTE gives aluminum nitride good thermal shock resistance. Furthermore, aluminum nitride has a flexural strength exceeding that of alumina and beryllia, exhibits a low hardness which enables it to be machined easily and is stable at temperatures in excess of 900° C. in an oxidizing environment and up to 1600° C. in a reducing environment.

Despite the promise of aluminum nitride, application of thick-films on aluminum nitride or aluminum nitride-containing substrates is severely limited by the lack of compatible thick-film paste compositions which adhere sufficiently to such materials. In order to function as an effective thick-film paste composition, the glass frit binder component must remain chemically stable in atmospheric moisture for periods of years and be chemically compatible with the substrate. The proven alumina-compatible, thick-film paste compositions are not compatible with aluminum nitride during firing. Most glass frit binders originally developed for thick-film pastes printed on alumina substrates contain substantial amounts of lead oxide which is thermodynamically incompatible with aluminum nitride. Aluminum nitride is oxidized by lead oxide during firing, producing nitrogen gas which physically disrupts and blisters the film and thereby destroys patterning and reduces thermal conductivity. Furthermore, most of the common glass fluxes used to make glasses having low dilatometric softening temperatures, as is required for thick-film glass binders, contain additives (e.g., ZnO, $P_2O_5$ and CdO) which are chemically incompatible with aluminum nitride during firing. Thus, a stable glass for use as a binder in aluminum nitride-compatible thick-film paste compositions is urgently needed.

SUMMARY OF THE INVENTION

Among the objects of the present invention, therefore, are the provision of a glass composition for use as a binder in thick-film paste compositions; the provision of such a glass composition which is chemically durable in atmospheric moisture; the provision of such a glass composition which exhibits a suitably low dilatometric softening temperature; the provision of a thick-film paste composition containing such a glass composition which is chemically compatible with an aluminum nitride substrate during firing; the provision of a method for adherently bonding a thick-film paste composition to an aluminum nitride substrate which does not result in physical disruption or blistering of the film and preserves the thermal conductivity of the substrate; and the provision of an aluminum nitride substrate having an electrically functional composition adherently bonded to at least a portion of a surface of the substrate.

Briefly, therefore, the present invention is directed to a mixed alkaline earth boroaluminate glass for use as a binder in aluminum nitride-compatible thick-film paste compositions. The glass comprises from about 30 to about 80 mole % $B_2O_3$, from about 2 to about 15 mole % $Al_2O_3$ and from about 2 to about 30 mole % $SiO_2$. The glass additionally comprises from about 10 to about 65 mole % RO, wherein RO comprises BaO and at least one other alkaline earth oxide selected from CaO, SrO and MgO. RO comprises, based on RO, at least about 20 mole % BaO and up to about 80 mole % CaO, up to about 80 mole % SrO and up to about 15 mole % MgO.

The invention is further directed to a thick-film paste composition for bonding to an aluminum nitride substrate comprising an electrically functional filler material, a mixed alkaline earth boroaluminate glass binder and an organic dispersion medium for the filler material and the glass binder. The electrically functional filler material is present in an amount sufficient to establish the electrical properties of the paste. The mixed alkaline earth boroaluminate glass binder comprises from about 30 to about 80 mole % $B_2O_3$ and from about 2 to about 15 mole % $Al_2O_3$. The glass further comprises from about 10 to about 65 mole % RO, wherein RO comprises BaO and at least one other alkaline earth oxide selected from CaO, SrO and MgO. RO comprises, based on RO, at least 20 mole % BaO and up to 80 mole % CaO, up to 80 mole % SrO and up to 15 mole % MgO.

The invention is further directed to a method for bonding a thick-film paste composition to an aluminum nitride substrate comprising applying a thick-film paste composition to an aluminum nitride substrate and heating the applied paste composition to a temperature sufficient to cause the glass binder to become bonded to the aluminum nitride substrate. The paste composition comprises an electrically functional filler material, a mixed alkaline earth boroaluminate glass binder and an organic dispersion medium for the filler material and the glass binder. The electrically functional filler material is present in an amount sufficient to establish the electrical properties of the paste. The mixed alkaline earth boroaluminate glass binder comprises from about 30 to about 80 mole % $B_2O_3$ and from about 2 to about 15 mole % $Al_2O_3$. The glass further comprises from about 10 to about 65 mole % RO, wherein RO comprises BaO and at least one other alkaline earth oxide selected from CaO, SrO and MgO. RO comprises, based on RO, at least 20 mole % BaO and up to 80 mole % CaO, up to 80 mole % SrO and up to 15 mole % MgO.

The invention is further directed to a substrate having a mixed alkaline earth boroaluminate glass binder bonded to at least a portion of a surface thereof. The glass binder comprises from about 30 to about 80 mole % $B_2O_3$ and from about 2 to about 15 mole % $Al_2O_3$. The glass binder further comprises from about 10 to about 65 mole % RO, wherein RO comprises BaO and at least one other alkaline earth oxide selected from CaO, SrO and MgO. RO comprises, based on RO, at least 20 mole % BaO and up to 80 mole % CaO, up to 80 mole % SrO and up to 15 mole % MgO.

The invention is further directed to a paste composition for applying and bonding a design onto a substrate comprising at least one pigment, a mixed alkaline earth boroaluminate glass binder and an organic dispersion medium for the pigment and the glass binder. The mixed alkaline earth boroaluminate glass binder comprises from about 30 to about 80 mole % $B_2O_3$ and from about 2 to about 15 mole % $Al_2O_3$. The glass further comprises from about 10 to about 65 mole % RO, wherein RO comprises BaO and at least one other alkaline earth oxide selected from CaO, SrO and MgO. RO comprises, based on RO, at least 20 mole % BaO and up to 80 mole % CaO, up to 80 mole % SrO and up to 15 mole % MgO.

Other objects and features of this invention will be in part apparent and in part pointed out hereinafter.

DETAILED DESCRIPTION OF THE PREFERRED EMBODIMENTS

In accordance with the present invention, a mixed alkaline earth boroaluminate glass is provided for use as a glass frit binder in aluminum nitride-compatible thick-film paste compositions.

Boroaluminate glasses containing BaO, commonly referred to as BABAL glasses, were observed to have the fundamental thermodynamic compatibility to serve as binder glasses in thick-film paste compositions applied to aluminum nitride substrates. However, single alkaline earth boroaluminate glasses lack the chemical durability required for use as binders in thick-film pastes. In accordance with the present invention, it has been discovered that by providing a mixture of alkaline earth oxides in boroaluminate glasses, the chemical durability of the glass can be improved so that it is comparable with conventional glass binders used in thick-film paste printed on alumina substrates while maintaining the improved thermal compatibility with aluminum nitride substrates and the favorable viscosity characteristics of BABAL glasses.

The mixed alkaline earth boroaluminate glasses of the present invention comprise from about 30 to about 80 mole % $B_2O_3$, from about 2 to about 15 mole % $Al_2O_3$ and from about 10 to about 65 mole % RO, wherein RO comprises BaO and at least one other alkaline earth oxide selected from CaO, SrO and MgO.

At least 20 mole % of the RO component of the glass is BaO (i.e, at least 20% of the total number of moles of RO present in the glass is BaO). Preferably from about 50 to about 90 mole % of the RO component of the glass is BaO. The presence of BaO helps to ensure that the softening temperature of the glass is suitably low. A low softening temperature is advantageous in glasses used as binders in thick-film paste compositions because it allows the printed substrate to be fired at lower temperatures. In the case of conductive thick-film pastes, where it is desirable to minimize the amount of glass binder employed, a low softening temperature is particularly advantageous. Generally, the lower a glass's softening temperature, the less viscous it is at conventional firing temperatures so that it flows easily through the conductive filler material causing the filler material to sinter together and bond to the substrate. However, if a glass exhibits a high softening temperature and, therefore, is more viscous at conventional firing temperatures, a greater proportion of the glass binder must be present in the paste to offset the decreased fluidity of the glass and ensure adequate bonding of the filler material to the substrate.

In the preferred glasses of the present invention in which from about 50 to about 90 mole % the RO component of the glass comprises BaO, the glass preferably comprises either from about 10 to about 40 mole % RO or from about 50 to about 65 mole % RO. RO content within these two specified ranges is preferred because these ranges correspond generally to especially low softening temperature regions within the mixed alkaline earth boroaluminate glass system. Glasses containing from about 10 to about 40 mole % RO combine a low softening temperature with a relatively low CTE, while glasses containing from about 50 to about 65 mole % RO have a low softening temperature but higher CTE values. Glasses containing from about 10 to about 40 mole % RO preferably further comprise from about 60 to about 85 mole % $B_2O_3$ and from about 5 to about 10 mole % $Al_2O_3$ while glasses containing from about 50 to about 65 mole % RO, preferably further comprise from about 30 to about 45 mole % $B_2O_3$ and from about 5 to about 15 mole % $Al_2O_3$.

By combining at least one of CaO, SrO or MgO with BaO in the RO component of the glasses of the present invention, a mixed alkaline earth effect is achieved which results in a dramatic improvement in the chemical durability of the glass. For example, a conventional BABAL glass comprising 60 mole % $B_2O_3$, 8 mole % $Al_2O_3$ and 32 mole % BaO exhibits a dissolution rate of about 58 mg/cm² after 16 hours of immersion in deionized water at 60° C. By comparison, if half of the BaO content (i.e., 16 mole %) is replaced with CaO, the resulting glass exhibits a dissolution rate of about 18 mg/cm² after 16 hours of immersion. In the glasses of the present invention, up to about 80 mole % of the RO component of the glass is CaO, up to about 80 mole % of the RO component of the glass is SrO and up to about 15 mole % of the RO component of the glass is MgO. Preferably, the concentration of the other alkaline earth oxide(s) (i.e., CaO, SrO and/or MgO) combined with BaO in the RO component of the glass is sufficient such that the glass exhibits a dissolution rate in deionized water at 60° C. of no greater than about 24 mg/cm², preferably no greater than about 20 mg/cm², after eight hours of immersion.

Although combining BaO with additions of CaO, SrO and/or MgO provides a more durable glass, it has been observed that these additions tend to increase the softening temperature of the glass as compared to a conventional BABAL glass. Of these three alkaline earth oxide constituents, MgO tends to increase the softening temperature of the glass more than CaO or SrO. Thus, the RO component of the glass preferably comprises BaO along with CaO, SrO or a mixture of CaO and SrO. If MgO is employed, the RO component of the glass comprises no more than about 15 mole % MgO to minimize the deleterious effects of this oxide on the softening temperature of the glass. Preferably, the additions of CaO, SrO and/or MgO are controlled such that the mixed alkaline earth boroaluminate glass has a dilatometric softening temperature no greater than about 620° C., preferably no greater than about 590° C.

In particularly preferred glasses of the present invention, the RO component of the glass comprises binary mixtures of BaO combined with CaO or SrO. For example, the RO component of the glass may comprise from about 50 to about 90 mole % BaO combined with from about 10 to about 50 mole % CaO or SrO.

The glass compositions are preferably free of lead which is thermodynamically incompatible with aluminum nitride. The glass may also comprise up to about 30 mole % $SiO_2$, preferably from about 2 to about 30 mole % $SiO_2$ and more preferably from about 5 to about 20 mole % $SiO_2$. The addition of up to 30 mole % $SiO_2$ further improves the chemical durability of the mixed alkaline earth boroaluminate glass and its thermal expansion compatibility with silicon without undue raising of the softening temperature.

Representative compositions of mixed alkaline earth boroaluminate glasses in which RO is a binary mixture of BaO and CaO are set forth in the Table below. The Table below Table I also lists the softening point, CTE and dissolution rate (after 16 hours of immersion in deionized water at 60° C.) for these glasses.

| Glass | Composition (mole %) | | | | | Softening Point (°C.) | Thermal Expansion (ppm/°C.) | Water Durability (mg/cm²) |
|---|---|---|---|---|---|---|---|---|
| | BaO | CaO | $Al_2O_3$ | $B_2O_3$ | $SiO_2$ | | | |
| 102 | 25.6 | 6.4 | 8.0 | 60.0 | 0.0 | 568 | 8.6 | 38 |
| 104 | 19.2 | 12.8 | 8.0 | 60.0 | 0.0 | 579 | 8.6 | 21 |
| 105 | 16.0 | 16.0 | 8.0 | 60.0 | 0.0 | 581 | 7.5 | 18 |
| 106 | 12.8 | 19.2 | 8.0 | 60.0 | 0.0 | 588 | 7.4 | 24 |
| 108 | 6.4 | 25.6 | 8.0 | 60.0 | 0.0 | 595 | 6.5 | 19 |
| 202 | 14.4 | 3.6 | 7.0 | 75.0 | 0.0 | 525 | 6.7 | 34 |
| 204 | 10.8 | 7.2 | 7.0 | 75.0 | 0.0 | 537 | 6.3 | 38 |
| 205 | 9.0 | 9.0 | 7.0 | 75.0 | 0.0 | 529 | 6.3 | 27 |
| 206 | 7.2 | 10.8 | 7.0 | 75.0 | 0.0 | 535 | 6.1 | 24 |
| 208 | 3.6 | 14.4 | 7.0 | 75.0 | 0.0 | 534 | 6.1 | 26 |
| 305 | 15.2 | 15.2 | 7.6 | 57.0 | 5.0 | 593 | 7.4 | 15 |
| 310 | 14.4 | 14.4 | 7.2 | 54.0 | 10.0 | 597 | 6.4 | 8 |
| 320 | 12.8 | 12.8 | 6.4 | 48.0 | 20.0 | 600 | 6.4 | 2 |

Mixed alkaline earth boroaluminate glass frits are prepared by conventional means. The specified oxides or materials producing these oxides are mixed together in amounts sufficient to yield a glass having the desired composition. This mixture is then placed in a crucible and heated in air to a temperature of at least about 1200° C. The resulting molten glass composition is then quenched and formed into glass particles suitable for milling, for example, by pouring the melt onto dry, cold steel rollers or by pouring the melt into water.

Thick-film paste compositions in accordance with the present invention may be prepared by combining suitably sized particulates of the mixed alkaline earth boroaluminate glass and an electrically functional filler material and dispersing the mixture in a liquid, organic medium. The mixture of glass binder and filler material may be blended with the organic dispersion medium on a roll mill until a reproducible degree of blending is achieved.

By properly selecting the electrically functional filler material used in preparing the paste, the thick-film printed on the substrate is imparted with the desired electrical property (e.g., conductive, dielectric or resistive). The specific identity of the electrically functional filler material is not critical to the present invention. All that is required is that it produce the desired electrical properties in the film bonded to the substrate. For a conductor paste, the electrically functional filler material comprises a conductive metal. Typical filler materials used in thick-film conductor pastes are Cu, Ag, Au and Pt. Pre-alloyed metals (e.g., Ag/Pd, Ag/Pt, Au/Pt and Pd/Au) may also be used in thick-film conductor pastes or mixtures of different metals may be added to the paste in the desired ratio and allowed to form a solid solution during firing of the printed substrate.

Thick-film resistors are widely used because they can satisfy certain design functions (e.g., high sheet resistance, power dissipation, frequency response, and high voltage requirements) that are difficult or impossible to achieve with silicon monolithic integrated circuits. In order to prepare a thick-film resistor paste, the electrically functional filler material is typically selected to be ruthenium oxide ($RuO_2$), but perovskites (e.g., $BaRuO_3$), pyrochlores (e.g., $Pb_2Ru_2O_{7-x}$), $IrO_2$, $Bi_2Ru_2O_7$, $Pb_2Ru_2O_6$, $SnO_2$, $In_2O_3$, $LaB_6$, $TiSi_2$ and TaN may also be used.

Dielectric films have a variety of uses in thick-film hybrid circuits (e.g., capacitor dielectrics, cross-overs, cover coats for environmental protection, package seals, solder dams, etc). Dielectric films are especially important in constructing multilayer, thick-film structures to produce very high density circuits. In such structures, dielectric films with or without via channels are placed between other films containing conductors and resistors. If a thick-film dielectric paste is desired, the mixed alkaline earth boroaluminate glass may be combined with one or more crystalline, refractory metal oxides (e.g., $Al_2O_3$, $SiO_2$ and $BaTiO_3$) as the electrically functional filler material. Alternatively, the glasses of the present invention may be used as both the electrically functional filler material and the binder in preparing dielectric pastes.

The mixed alkaline earth boroaluminate glass binder and the electrically functional filler material are present in the thick-film paste as powders. The rheological properties of thick-film pastes are strongly influenced by the size, shape and concentration of these particles. Glass frit binders in accordance with the present invention are prepared by milling the mixed alkaline earth boroaluminate glass to a maximum particle size from about 30 to about 100 µm, preferably from about 40 to about 75 µm. The average particle size of the electrically functional filler material is typically no greater than about 100 µm and often comprises submicron particles. Depending upon the type of thick-film paste (e.g., conductive, resistive dielectric) and the particular electrical properties desired in the printed film, the ratio of volumetric proportions of filler material to glass binder combined in the paste preparation may vary widely. Proper selection of particulate sizes and proportions of glass binder and filler material used in preparing thick-film pastes is well-known to those skilled in the art and this practice is unchanged in carrying out the present invention.

Any inert, organic liquid can be used as the dispersion medium in the practice of the present invention. Suitable organic dispersion mediums include: aliphatic alcohols; ethers of such alcohols (e.g., the acetates and propionates); terpenes (e.g., pine oil, terpineol); or solutions of resins (e.g., polymethacrylates of lower alcohols). Preferably, the organic dispersion medium used in the preparation of thick-film pastes is a polymer of high molecular weight such as ethyl cellulose or an acrylic resin dissolved in a low vapor pressure solvent (e.g., pine oil, terpineol, butyl carbinol, glycol ether acetate or Carbitol ®).

The thick-film pastes must be viscous enough to retain the binder glass and filler material particles in suspension and meet the processing requirements of thick-film printing. In addition to the three primary components, the thick-film pastes may further contain additives either to optimize the properties of the printed films or the rheological behavior of the paste.

The thick-film paste compositions of the present invention may be used to print hybrid circuit patterns onto suitable substrates such as alumina, silicon carbide and aluminum nitride using conventional thick-film processing techniques. The thick-film paste compositions may also be used to print hybrid circuit patterns onto green tapes which densify at conventional thick-film firing temperatures. Due to the improved thermal compatibility of the mixed alkaline earth binder glasses with aluminum nitride, the thick film paste compositions of the present invention are especially advantageous for use in printing circuit patterns onto aluminum nitride substrates. As used herein aluminum nitride substrate is intended to mean a substrate containing in excess of 25% by volume aluminum nitride.

In order to bond a thick-film paste composition of the present invention to a substrate as part of a hybrid circuit, the paste composition is applied to the substrate by passing the paste through a stencil, mask or screen of the desired pattern and onto at least a portion of a surface of the substrate. Most hybrid, thick-film circuits are produced using stainless steel mesh screens. Due to their high viscosities, the thick-film pastes cannot flow through the mesh screens by the action of gravity alone. Therefore, pressure is applied by passing a squeegee over the side of the screen on which the paste has been deposited to force the paste through the apertures of the screen and onto a surface of the substrate. Care must be exercised to apply the appropriate amount of pressure to the squeegee during printing. The pressure applied by the squeegee must be sufficient to ensure complete filling of each aperture before the squeegee traverses the aperture, but should not be so high that the paste spreads out between the screen and the substrate.

The thickness of each thick-film applied to a substrate may be varied as desired by controlling the composition of the paste and other process parameters. Typically, in hybrid circuit printing, the thickness of the films is between about 10 and about 50 µm. The control of film thickness and uniformity is within the skill of those skilled in the art and is unchanged in the practice of the present invention.

After the paste is screened onto the substrate, it is allowed to level for about 5 to 15 minutes at room temperature. The deposited film is then oven dried at about 100° to about 150° C. for about 10 to 15 minutes to remove volatile solvents. After drying, the film is fired at temperatures from about 500° to about 1000° C., preferably at temperatures from about 825° to about 900° C. Depending upon the composition of the paste and the desired end product, firing may take place in air or in a non-oxidizing environment. In commercial practice, thick-films may be fired using conveyor belt kilns and specified firing protocols. In the initial phase of firing, organic resins are burned off. As the temperature continues to rise to the peak firing temperature, glass frit bonding occurs by the migration of the molten glass binder to the substrate surface where a bond forms between the oxide glass and the substrate. Subsequent glass flow into the partially sintered matrix of the electrically functional filler material assists further densification of the film and forms an interlocked structure with the filler material bonded to the substrate. The material is held at the peak firing temperature for approximately 20 minutes in order to assure adequate bonding. The entire firing cycle may last from 30 to 60 minutes.

Multiple printings and firings may be used to produce a desired combination of conductors, resistors, dielectrics, etc. on a single substrate. Once printing and firing of the thick-film circuits is complete, discrete components (e.g., IC chips, inductors, capacitors, transducers, sensors, resistors, etc) may be attached to the printed circuit. The thick-film resistors and dielectrics may be adjusted to a specific value either before or after the addition of the discrete components. Finally, the circuit is packaged.

The mixed alkaline earth boroaluminate glasses of the present invention may be used as binder glasses in paste compositions other than those used to print hybrid microelectronic circuits. For example, the mixed alkaline earth boroaluminate glasses are useful in preparing pastes used to print and fire labels or decorations onto a variety of materials such as glass bottles, ceramics and enameled metal. Such pastes may be prepared by combining suitably sized (e.g., less than 100 μm) particulates of the mixed alkaline earth boroaluminate glass with at least one pigment (e.g., $TiO_2$, $Fe_2O_3$, $Cr_2O_3$, ZnO) and dispersing the mixture in a liquid, organic medium. As with the previously described thick-film paste compositions, any inert, organic liquid (e.g., ethyl cellulose dissolved in glycol ether acetate or Carbitol ®) may be used as the dispersion medium in preparing decorating pastes.

Depending upon the type of decorating paste and the particular application, the size of the particulates of glass and pigments) used in preparing such pastes as well as the proportions of glass, pigment and dispersion medium combined to form the decorating paste composition may vary considerably. Proper selection of particulate sizes and proportions of glass, pigment and dispersion medium used in preparing decorating pastes is well-known to those skilled in the art and this practice is unchanged in the present invention.

The decorating paste may be applied to the substrate to form the desired pattern or design by a variety of means well-known in the art, including screen printing and transfer printing. Once applied, the patterned paste is bonded to the substrate by heating the printed substrate to a firing temperature compatible with the substrate. Upon heating, the volatile components of the decorating paste are burned off and, as the temperature continues to rise to the peak firing temperature, glass frit bonding occurs by the migration of the molten glass binder to the substrate surface where a bond forms between the oxide glass and the substrate. Subsequent glass flow into the partially sintered matrix of the pigment assists further densification of the printed design and forms an interlocked structure with the pigment bonded to the substrate.

The present invention is illustrated by the following Example which is merely for the purpose of illustration and is not to be regarded as limiting the scope of the invention or manner in which it may be practiced.

EXAMPLE 1

Conductor Formulation

A thick-film conductor paste was prepared using a mixture of silver and a mixed alkaline earth boroaluminate glass of the present invention. The paste was then used to print conductor films onto an aluminum nitride substrate.

The glass binder used in this example comprised 54 mole % $B_2O_3$, 7.2 mole % $Al_2O_3$, 10 mole % $SiO_2$, 14.4 mole % BaO and 14.4 mole % CaO (i.e., the glass contained 28.8 mole % RO wherein RO comprised a 50/50 mole % mixture of BaO and CaO). The thick-film conductor paste was made by first grinding the glass to an average particle size no greater than about 75 μm and mixing it with a submicron silver powder used in a commercial thick-film conductor paste. The mixture comprised 85 volume % silver and 15 volume % glass binder. The mixture was added to an organic dispersion medium comprising ethyl cellulose in glycol ether acetate to form a screenable paste. The resulting paste was hand screened onto an aluminum nitride substrates and fired in a conventional thick-film firing schedule which culminated in 20 minutes at a maximum temperature of 850° C. The softening characteristics of the binder glass appeared to be entirely satisfactory for firing at the conventional temperatures of thick-film firing. The resulting conductor films were analyzed with SEM and showed the same structure as conventional conductor pastes printed and fired on alumina substrates, yet without the blistering which occurs with such pastes on aluminum nitride.

In view of the above, it will be seen that the several objects of the invention are achieved.

As various changes could be made in the above-described invention without departing from the scope of the invention, it is intended that all matter contained in the above description be interpreted as illustrative and not in a limiting sense.

What is claimed is:

1. A mixed alkaline earth boroaluminate glass for use as a binder in aluminum nitride-compatible thick-film paste compositions, the glass comprising from about 30 to about 80 mole % $B_2O_3$, from about 2 to about 15 mole % $Al_2O_3$, from about 5 to about 20 mole % $SiO_2$ and from about 10 to about 65 mole % of a mixed alkaline earth oxide component, RO, wherein RO comprises BaO and at least one other alkaline earth oxide selected from CaO, SrO and MgO, RO comprising, based on RO, at least about 20 mole % BaO and up to about 80 mole % CaO, up to about 80 mole % SrO and up to 15 mole % MgO.

2. A mixed alkaline earth boroaluminate glass as set forth in claim 1 wherein the glass is lead free.

3. A mixed alkaline earth boroaluminate glass as set forth in claim 2 wherein the glass has a dilatometric softening temperature no greater than about 620° C.

4. A mixed alkaline earth boroaluminate glass as set forth in claim 2 wherein the glass exhibits a dissolution rate immersed in deionized water at 60° C. of no greater than about 24 mg/$cm^2$ after eight hours.

5. A mixed alkaline earth boroaluminate glass as set forth in claim 2 wherein RO comprises from about 50 to about 90 mole % BaO.

6. A mixed alkaline earth boroaluminate glass as set forth in claim 5 wherein the glass comprises from about 60 to about 85 mole % $B_2O_3$, from about 5 to about 10 mole % $Al_2O_3$ and from about 10 to about 40 mole % RO.

7. A mixed alkaline earth boroaluminate glass as set forth in claim 5 wherein the glass comprises from about 30 to about 45 mole % $B_2O_3$, from about 5 to about 15 mole % $Al_2O_3$ and from about 50 to about 65 mole % RO.

8. A mixed alkaline earth boroaluminate glass as set forth in claim 2 wherein RO comprises BaO and at least one other alkaline earth oxide selected from CaO and SrO, RO comprising, based on RO, at least about 20 mole % BaO and up to about 80 mole % CaO and up to about 80 mole % SrO.

9. A mixed alkaline earth boroaluminate glass as set forth in claim 8 comprising from about 60 to about 85 mole % $B_2O_3$, from about 5 to about 10 mole % $Al_2O_3$, from about 5 to about 20 mole % $SiO_2$ and from about 10 to about 40 mole % RO, RO comprising, based on RO, from about 50 to about 90 mole % BaO and from about 10 to about 50 mole % CaO.

10. A mixed alkaline earth boroaluminate glass as set forth in claim 8 comprising from about 60 to about 85 mole % $B_2O_3$, from about 5 to about 10 mole % $Al_2O_3$, from about 5 to about 20 mole % $SiO_2$ and from about 10 to about 40 mole % RO, RO comprising, based on RO, from about 50 to about 90 mole % BaO and from about 10 to about 50 mole % SrO.

11. A thick-film paste composition for bonding to an aluminum nitride substrate comprising:

an electrically functional filler material present in an amount sufficient to establish the electrical properties of the paste;

a mixed alkaline earth boroaluminate glass binder, said glass binder comprising from about 30 to about 80 mole % $B_2O_3$, from about 2 to about 15 mole % $Al_2O_3$, up to about 30 mole % $SiO_2$ and from about 10 to about 65 mole % of a mixed alkaline earth oxide component, RO, wherein RO comprises BaO and at least one other alkaline earth oxide selected from CaO, SrO and MgO, RO comprising, based on RO, at least about 20 mole % BaO and up to about 80 mole % CaO, up to about 80 mole % SrO and up to 15 mole % MgO; and an organic dispersion medium for said filler material and said glass binder.

12. A thick-film paste composition as set forth in claim 11 wherein said mixed alkaline earth boroaluminate glass binder is lead free.

13. A paste composition for applying and bonding a design onto a substrate comprising:

at least one pigment;

a mixed alkaline earth boroaluminate glass binder, said glass binder comprising from about 30 to about 80 mole % $B_2O_3$, from about 2 to about 15 mole % $Al_2O_3$, up to about 30 mole % $SiO_2$ and from about 10 to about 65 mole % of a mixed alkaline earth oxide component, RO, wherein RO comprises BaO and at least one other alkaline earth oxide selected from CaO, SrO and MgO, RO comprising, based on RO, at least about 20 mole % BaO and up to about 80 mole % CaO, up to about 80 mole % SrO and up to 15 mole % MgO; and an organic dispersion medium for said pigment and said glass binder.

14. A mixed alkaline earth boroaluminate glass for use as a binder in aluminum nitride-compatible thick-film paste compositions, the glass comprising from about 30 to about 80 mole % $B_2O_3$, from about 2 to about 15 mole % $Al_2O_3$, from about 5 to about 20 mole % $SiO_2$ and from about 10 to about 65 mole % of a mixed alkaline earth oxide component, RO, wherein RO consists of, based on RO, at least about 20 mole % BaO, the remainder of RO being at least one other alkaline earth oxide selected from CaO and SrO.

15. A mixed alkaline earth boroaluminate glass as set forth in claim 14 wherein RO consists of, based on RO, from about 50 to about 90 mole % BaO, the remainder of RO being at least one other alkaline earth oxide selected from CaO and SrO.

16. A mixed alkaline earth boroaluminate glass as set forth in claim 15 comprising from about 60 to about 85 mole % $B_2O_3$, from about 5 to about 10 mole % $Al_2O_3$, from about 5 to about 20 mole % $SiO_2$ and from about 10 to about 40 mole % RO, RO consisting of, based on RO, from about 50 to about 90 mole % BaO and from about 10 to about 50 mole % CaO.

17. A mixed alkaline earth boroaluminate glass as set forth in claim 15 comprising from about 60 to about 85 mole % $B_2O_3$, from about 5 to about 10 mole % $Al_2O_3$, from about 5 to about 20 mole % $SiO_2$ and from about 10 to about 40 mole % RO, RO consisting of, based on RO, from about 50 to about 90 mole % BaO and from about 10 to about 50 mole % SrO.

18. A mixed alkaline earth boroaluminate glass as set forth in claim 15 wherein the glass comprises from about 30 to about 45 mole % $B_2O_3$, from about 5 to about 15 mole % $Al_2O_3$, from about 5 to about 20 mole % $SiO_2$ and from about 50 to about 65 mole % RO, RO consisting of, based on RO, from about 50 to about 90 mole % BaO and from about 10 to about 50 mole % CaO.

19. A mixed alkaline earth boroaluminate glass as set forth in claim 15 wherein the glass comprises from about 30 to about 45 mole % $B_2O_3$, from about 5 to about 15 mole % $Al_2O_3$, from about 5 to about 20 mole % $SiO_2$ and from about 50 to about 65 mole % RO, RO consisting of, based on RO, from about 50 to about 90 mole % BaO and from about 10 to about 50 mole % SrO.

20. A thick-film paste composition for bonding to an aluminum nitride substrate comprising:

an electrically functional filler material present in an amount sufficient to establish the electrical properties of the paste;

a mixed alkaline earth boroaluminate glass binder, said glass binder comprising from about 30 to about 80 mole % $B_2O_3$, from about 2 to about 15 mole % $Al_2O_3$, from about 5 to about 20 mole % $SiO_2$ and from about 10 to about 65 mole % of a mixed alkaline earth oxide component, RO, wherein RO consists of, based on RO, at least about 20 mole % BaO, the remainder of RO being at least one other alkaline earth oxide selected from CaO and SrO; and an organic dispersion medium for said filler material and said glass binder.

* * * * *